United States Patent [19]

Lichtblau

[11] 3,967,161

[45] *June 29, 1976

[54] MULTI-FREQUENCY RESONANT TAG CIRCUIT FOR USE WITH AN ELECTRONIC SECURITY SYSTEM HAVING IMPROVED NOISE DISCRIMINATION

[76] Inventor: George Jay Lichtblau, 425 E. 63rd St. Suite E - 12-D, New York, N.Y. 10021

[ * ] Notice: The portion of the term of this patent subsequent to May 7, 1991, has been disclaimed.

[22] Filed: July 19, 1974

[21] Appl. No.: 490,011

Related U.S. Application Data

[63] Continuation of Ser. No. 262,465, June 14, 1972, Pat. No. 3,863,244.

[52] U.S. Cl. .................... 317/101 R; 340/280; 340/258 C; 336/200; 336/232
[51] Int. Cl.² .................. H02B 1/04; H02B 9/00; G08B 21/00
[58] Field of Search ........... 340/280, 258 R, 258 C; 343/6.5 SS; 317/101 R, 101 B; 336/200, 232

[56] References Cited
UNITED STATES PATENTS
3,810,147   5/1974   Lichtblau .................... 340/280 R Primary Examiner—John W. Caldwell
Assistant Examiner—William M. Wannisky
Attorney, Agent, or Firm—Weingarten, Maxham & Schurgin

[57] ABSTRACT

An electronic security system adapted for use in a controlled area such as a retail store and employing a multi-frequency resonant tag circuit having distinct frequencies for detection and discrimination. An electromagnetic field is provided within the controlled area at a frequency which is swept through a range including the detection frequency of the resonant tag circuit. In the presence of a tag circuit within the controlled area, pulses are detected by a receiver which includes noise rejection circuitry for discriminating true signals from noise. The noise rejection circuitry is sensitive to expected signals and operative to discriminate true signals from noise on the basis of several different criteria, resulting in substantially reduced false alarm actuation.

6 Claims, 38 Drawing Figures

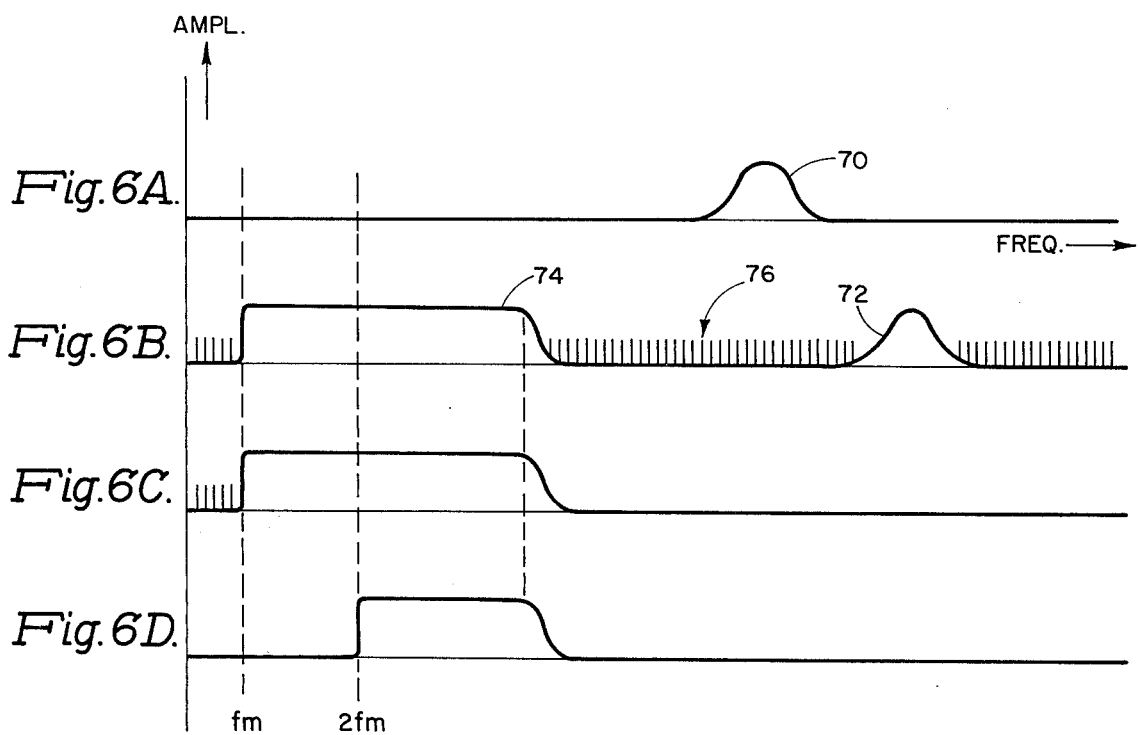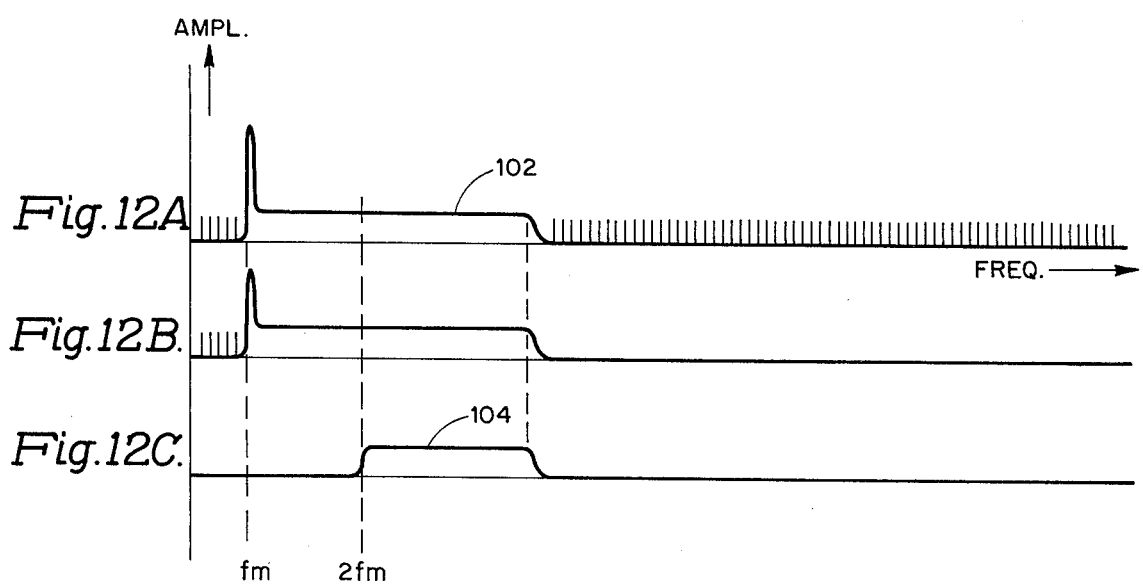

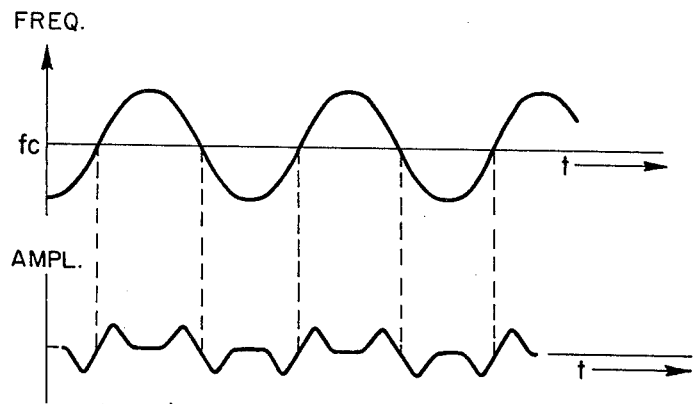
Fig. 7A.
Fig. 7B.
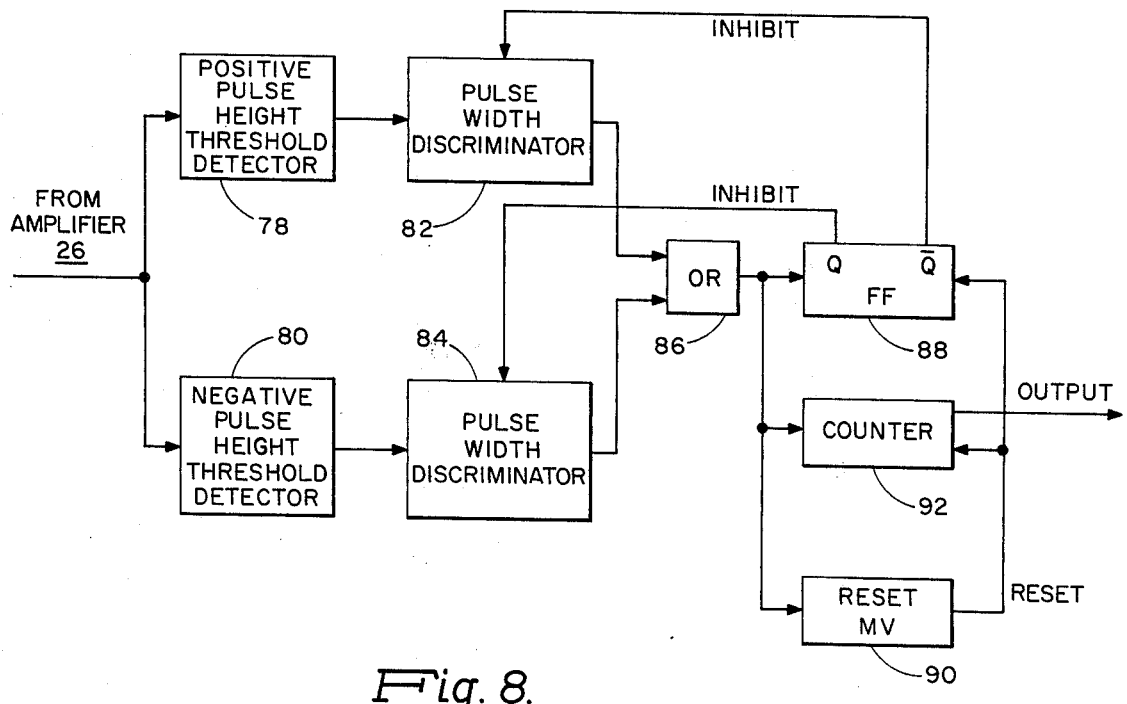
Fig. 8.

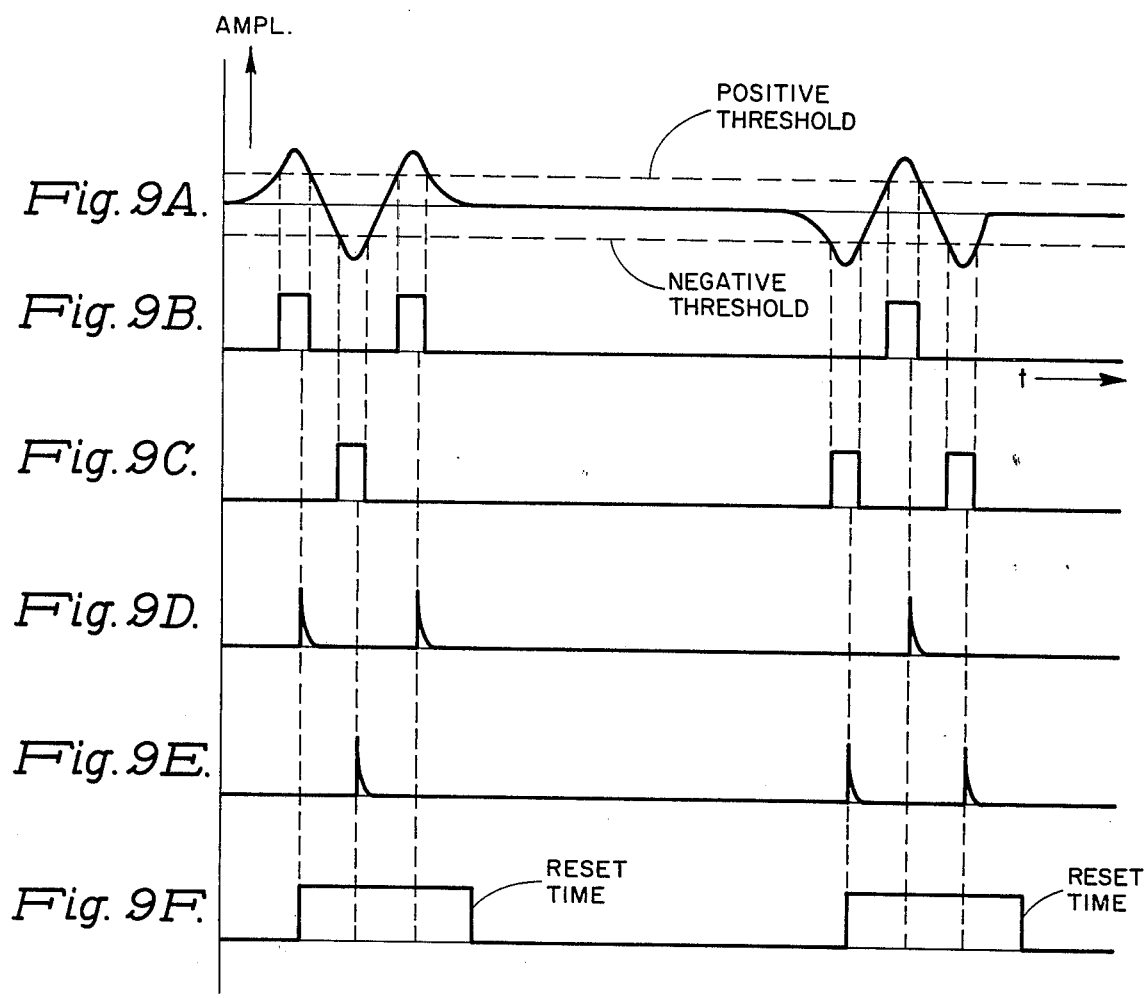
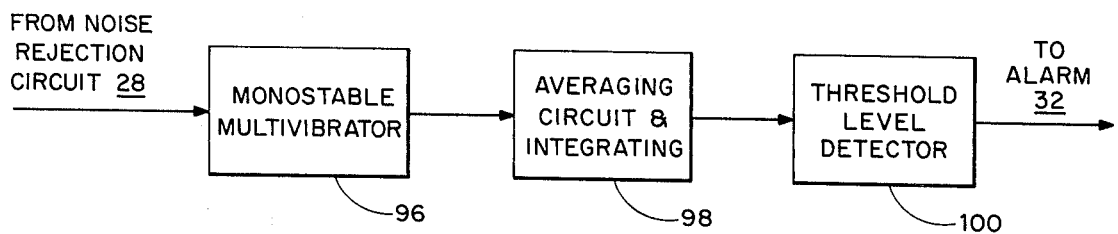
Fig. 10.

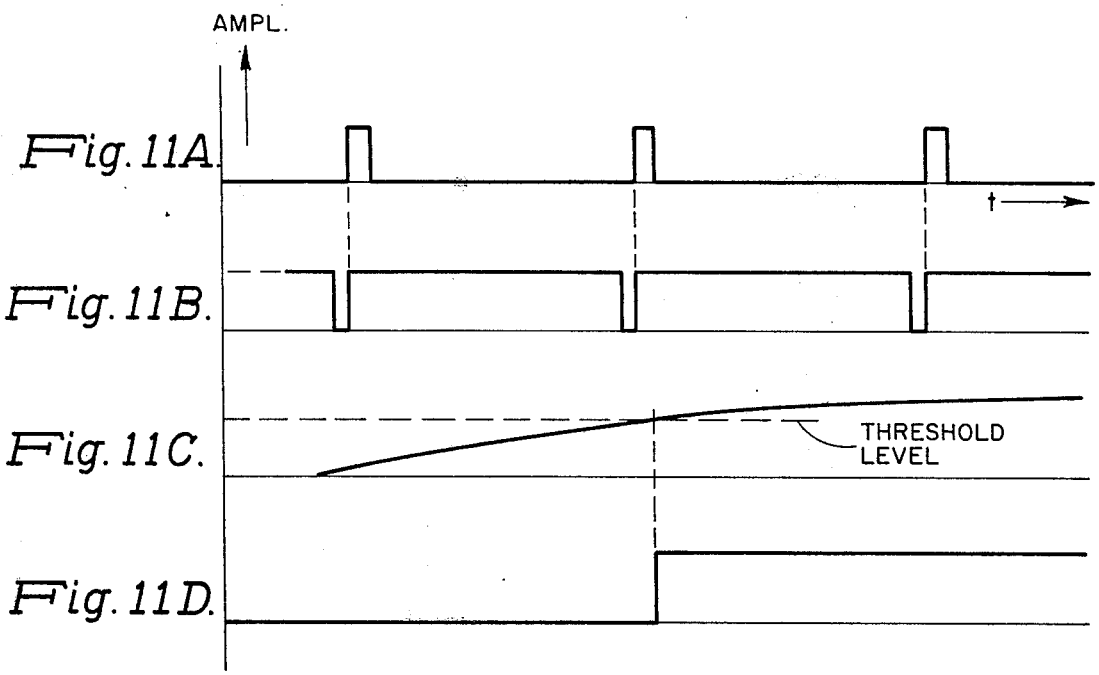
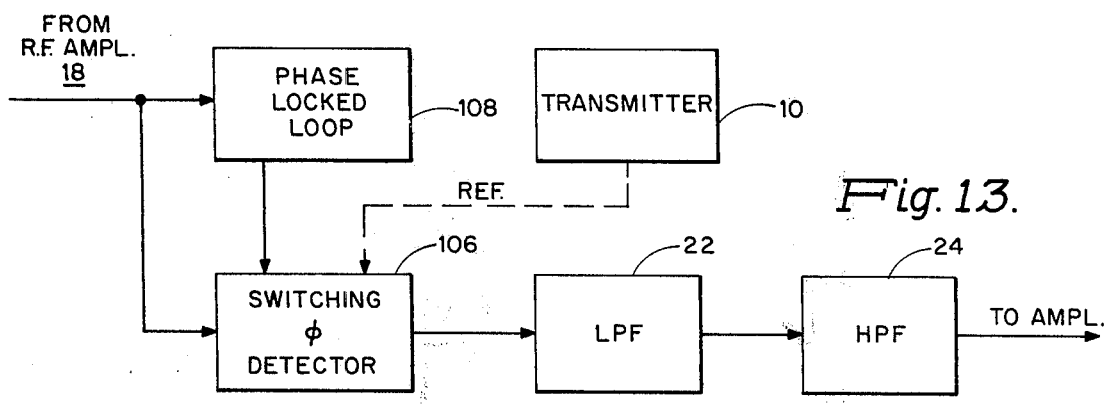
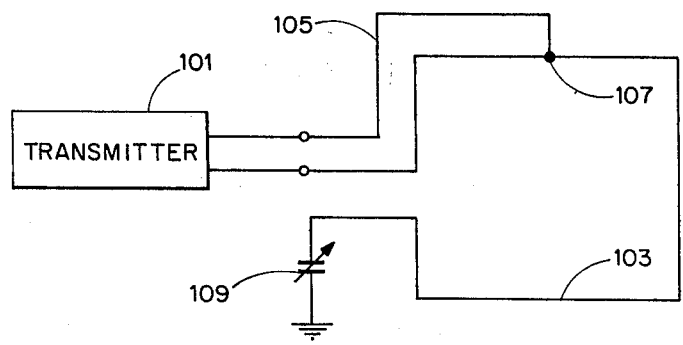

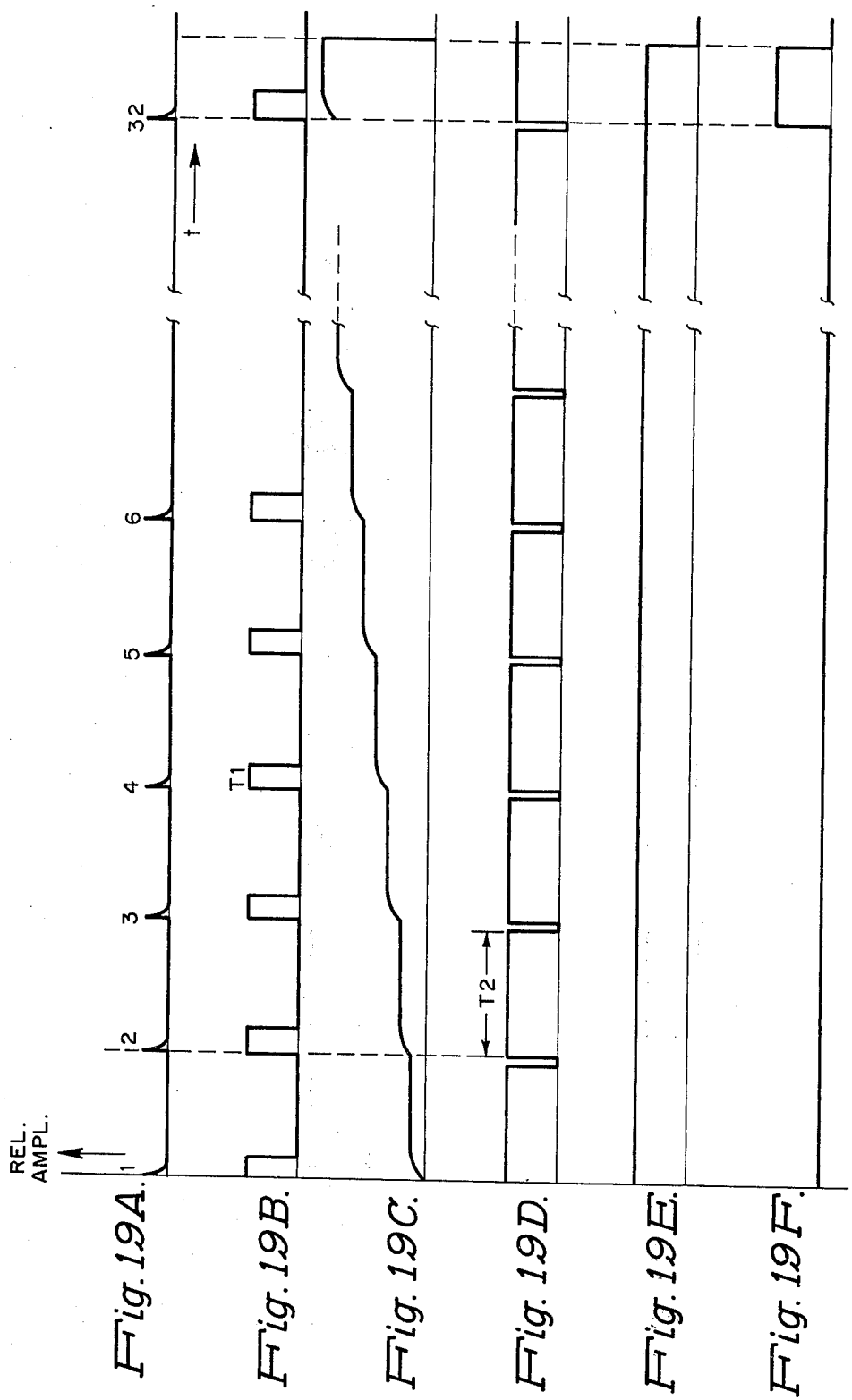

A MULTI-FREQUENCY RESONANT TAG CIRCUIT FOR USE WITH AN ELECTRONIC SECURITY SYSTEM HAVING IMPROVED NOISE DISCRIMINATION

This is a continuation of application Ser. No. 262,465, filed June 14, 1972, now U.S. Pat. No. 3,863,244.

FIELD OF THE INVENTION

This invention relates to an electronic security system and more particularly to a radio frequency system for the reliable detection of a resonant tag circuit within a controlled area and for the discrimination of signals produced by a detected tag from spurious signals and noise.

BACKGROUND OF THE INVENTION

Electronic security systems have been proposed for detecting the unauthorized removal of articles from an area under protection. Such systems have been proposed especially for use in retail stores to prevent the theft of articles from the store and to minimize the considerable losses occasioned by shoplifting. Such systems generally include an electromagnetic field provided in a controlled area through which merchandise must pass in leaving the store. A resonant circuit is attached to articles of merchandise and the presence of the resonant circuit in the controlled area is sensed by a receiving system to denote the unauthorized removal of an article. The resonant circuit is removed by store personnel or can be electronically altered such that an article properly leaving the store can pass through the controlled area without alarm activation.

A particularly effective electronic security system is described in copending application Ser. No. 214,361, filed December 30, 1971 now U.S. Pat. No. 3,810,147, by the same inventor as herein, in which a multi-frequency resonant tag circuit is provided having a first frequency to permit detection by electromagnetic interrogation of the tag and a second frequency to permit the deactivation of the tag by an applied electromagnetic field which destroys the resonance of the tag circuit at its detection frequency. The present invention is an improvement over the system of the copending application and provides enhanced discrimination of intended signals provided by a detected tag circuit from noise and spurious signal conditions which may be present in an operating environment.

SUMMARY OF THE INVENTION

In accordance with the present invention an electronic security system is provided for detection of a resonant tag circuit even in the presence of substantially stronger background noise and wherein an alarm indication is provided only after the signal being processed meets predetermined criteria distinguishing true tag signals from noise. The resonant tag circuit is detected by either AM, FM or phase detection techniques and the detected signal low pass filtered to remove carrier frequency components and other high frequency noise. After low pass filtering, a sharp cutoff high pass filter is employed to pass only the higher portion of the signal spectrum such that abrupt or faster changes in the frequency of a received signal caused by the presence of a resonant tag circuit are detected for subsequent processing and less abrupt frequency changes such as typically caused by spurious conditions are effectively attenuated sufficiently to not materially affect signal processing and subsequent alarm actuation. Thus the system is operative to discriminate between the rate at which the frequency of a received signal changes to ascertain whether the signal is caused by a tag circuit or by noise conditions.

The resonant tag circuit is preferably a multi-frequency circuit operative at a first frequency to permit detection by electromagnetic interrogation by suitable transmitting apparatus and operative at a second frequency to permit the deactivation thereof by an applied electromagnetic field which destroys the resonance of the circuit at its detection frequency. The system is sufficiently sensitive to permit radiation at a detection frequency at levels below the minimum radiation requirements of the Federal Communications Commission (FCC) and thereby eliminating the requirement for an operating license. It is a feature of the invention that the deactivation frequency of the resonant tag can be at one of the frequencies designated by the FCC to have unlimited radiated power levels. Sufficient power is thus readily provided for tag deactivation and operation at these designated frequencies similarly does not require an operating license. The tag circuit is composed wholly of passive elements and is typically formed by printed or etched circuit techniques as a small tag or card adapted to be attached to articles being protected. A fusable link can be provided which preferably is an integral element of the resonant circuit and permitting the inexpensive and facile manufacture of the circuit by mass production techniques.

Briefly, the system constructed according to the invention comprises transmitting apparatus for providing an electromagnetic field at a controlled area at a frequency swept through a predetermined range which includes the detection frequency of the tag circuit. Receiving apparatus is provided for detecting pulses caused by the presence of the tag circuit in the radiated field, the detected pulses being processed to discriminate true signals from noise on the basis of frequency spectrum, amplitude, modulation rate and pulse characteristics to provide output pulses which are then employed to actuate an alarm or other suitable output indication. The tag circuit can be deactivated by a transmitter operative at the tag deactivation frequency to cause destruction of the fusable link to destroy the resonant properties of the tag at its detection frequency.

DESCRIPTION OF THE DRAWINGS

The invention will be more fully understood from the following detailed description taken in conjunction with the accompanying drawings, in which:

FIGS. 6A through D are plots of spectral diagrams useful in illustrating operation of an amplitude modulated embodiment of the invention;

FIGS. 7A and 7B are plots of signal diagrams useful in illustrating operation of the amplitude modulated embodiment of the invention;

FIG. 8 is a block diagram representation of one type of noise rejection circuitry employed in the invention;

FIGS. 9A through 9F are plots of signal diagrams useful in illustrating operation of the circuitry of FIG. 8;

FIG. 10 is a block diagram representation of additional noise rejection circuitry embodied in the invention;

FIGS. 11A through 11D are plots of signal diagrams useful in illustrating operation of the embodiment of FIG. 10;

FIGS. 12A through 12C are plots of spectral diagrams useful in illustrating operation of a phase modulation embodiment of the invention;

FIG. 13 is a block diagram representation of a switching phase detector embodied in the invention;

FIG. 14 is a diagrammatic representation of a deactivation system embodied in the invention;

FIGS. 19A through 19F are plots of signal diagrams useful in illustrating operation of the circuitry of FIG. 18.

DETAILED DESCRIPTION OF THE INVENTION

Figure 1:
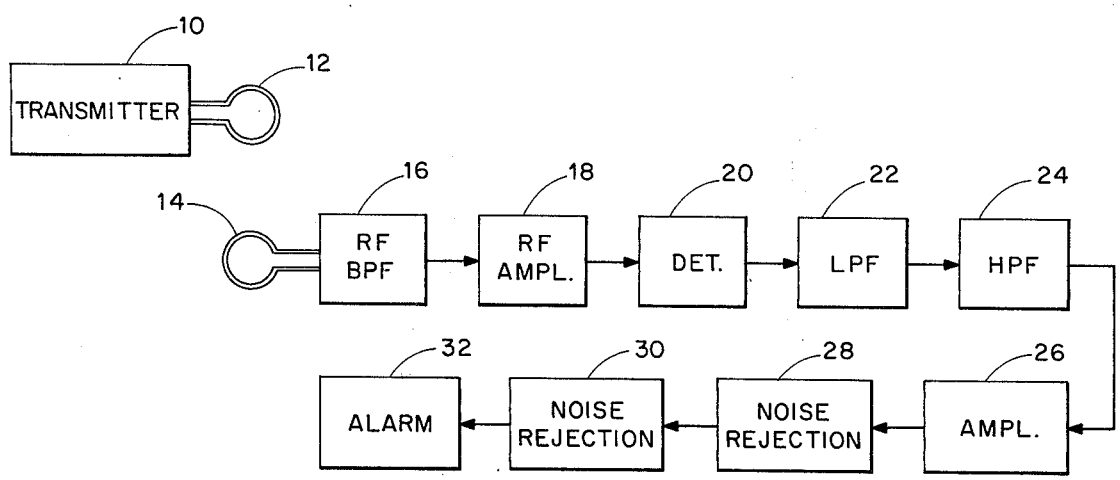
FIG. 1 is a block diagram representation of a security system according to the invention.

An electronic security system embodying the invention is depicted in block diagram form in FIG. 1 and includes a transmitter 10 coupled to an antenna 12 operative to provide an electromagnetic field within a predetermined area to be controlled. A receiving antenna 14 is arranged at the controlled area to receive energy radiated by transmitting antenna 12 and to couple received energy to an RF front-end which includes an RF bandpass filter 16 and an RF amplifier 18. The output of amplifier 18 is applied to a detector 20, the output of which is coupled to a low pass filter 22 operative to remove carrier frequency components and high frequency noise. The output of filter 22 is applied to a high pass filter 24 which is effective to pass only the higher frequency portion of the signal spectrum. The high pass filter is preferably a sharp cutoff filter such as a multiple pole Chebysheff filter. The output signals of filter 24 are amplified by amplifier 26 and are then applied to noise rejection circuitry 28 operative to provide an output signal in response to received signals of proper amplitude, pulse width, pulse spacing, polarity and sequence such that output pulses are provided only in response to true signals caused by a resonant tag in the detection zone. The pulses provided by noise rejection circuitry 28 are applied to a second noise rejection circuit 30 which is responsive to received signals of a predetermined pulse repetition rate at the modulation frequency to provide output signals for actuation of an alarm 32 or other output utilization apparatus.

Figure 2:
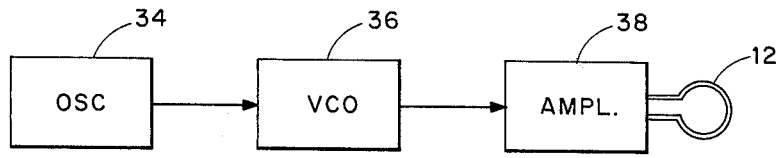
FIG. 2 is a block diagram representation of the transmitter of FIG. 1.

The transmitter 10 is illustrated in greater detail in FIG. 2 and includes an oscillator 34 for providing a modulation signal to a voltage controlled oscillator 36 which, in turn, drives amplifier 38 which drives the transmitting antenna 12. The oscillator 34 provides a regularly recurring waveform at a predetermined frequency, typically 1 KHz. The voltage controlled oscillator 36 provides a carrier signal which is varied in frequency under the influence of the modulation signal from oscillator 34. As a typical example, the carrier frequency can have a 5 MHz center frequency varied with a 15% frequency deviation at a 1 KHz rate. The modulation signal provided by oscillator 34 is typically a sinusoidally varying waveform but can be any regularly recurring waveform such as a triangle wave, saw tooth, ramp or exponential signal. Amplifier 38 preferably provides a driving current to the transmitting antenna 12 of a magnitude which varies inversely with frequency, and as a result the signal received by antenna 14 is of an amplitude which is constant with changes in frequency.

In the absence of a resonant circuit in the controlled area, the electromagnetic field provided by antenna 12 is sensed by receiving antenna 14 but no output radiation is provided by the receiving system and no pulse response is present to trigger the alarm. When a resonant tag is present in the controlled area, the tag becomes maximally responsive to the transmitted signal each time the transmitted sweep frequency passes through the resonant detection frequency of the tag, giving rise to a sensible change in electrical characteristics at the receiving antenna to cause detection of tag presence. In many operating environments, however, noise is present which can give rise to spurious signals which could, but for the invention, be processed to provide an erroneous alarm indication. The present invention substantially eliminates the likelihood of alarm actuation in the presence of other than true resonant tag signals.

Figure 3:
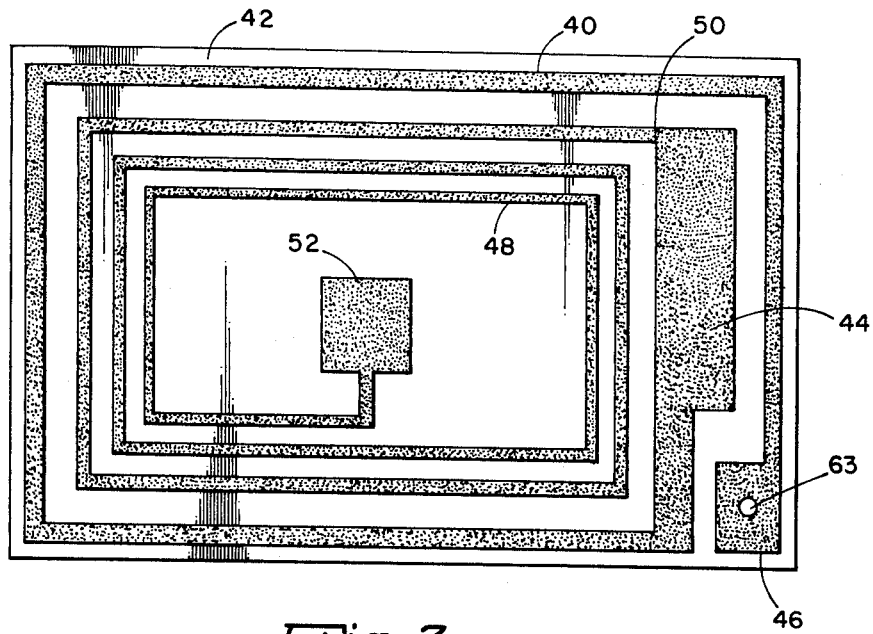
FIG. 3 is a pictorial view of one side of a resonant tag circuit embodying the invention.

A multi-frequency resonant circuit embodied on a card or tag adapted to be affixed to items of merchandise and the like is illustrated in FIG. 3. The circuit is formed by printed or etched circuit techniques and includes a first conductive path 40 arranged in a generally rectangular path on a surface of an insulative substrate 42 and terminating at one end in a conductive area 44 disposed in adjacent spaced relationship near one edge of substrate 42. The other end of path 40 terminates at conductive area 46 disposed near one corner of substrate 42. A second conductive path 48 is formed as a rectangular spiral on substrate 42 and terminates at its outer end at a junction 50 with area 44, and at its inner end at a conductive area 52 centrally of the spiral.

Figure 4:
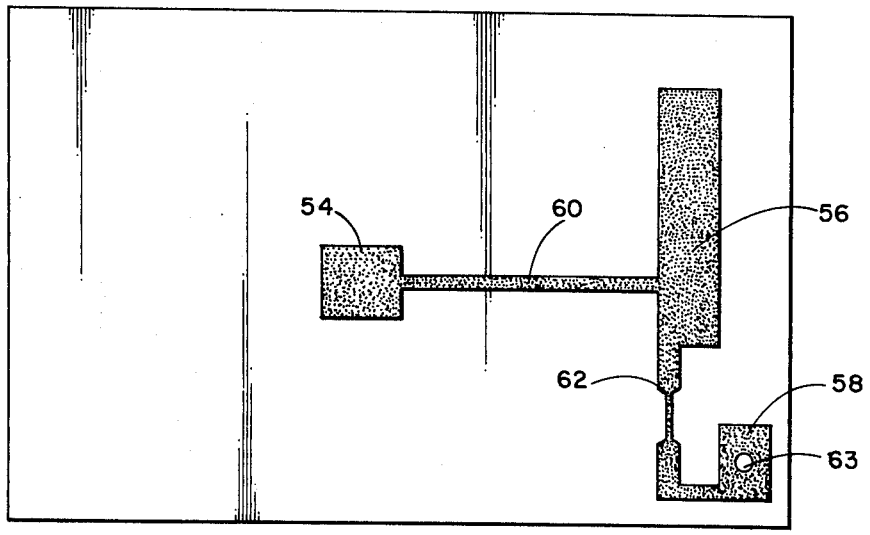
FIG. 4 is a pictorial view of the opposite side of the resonant tag circuit of FIG. 3.

The opposite surface of substrate 42 is illustrated in FIG. 4 and includes a conductive area 54 in alignment and generally coextensive with conductive area 52 on the substrate surface depicted in FIG. 3, and a pair of conductive areas 56 and 58 in alignment and generally coextensive with areas 44 and 46 on the other surface. The conductive areas 54 and 56 are interconnected with a conductive path 60, while the conductive areas 56 and 58 are interconnected by a conductive path 62. As will be further described hereinbelow, path 62 is dimensioned to fuse upon energization by a predetermined electromagnetic field to alter the resonant properties of the tag circuit. Electrical connection 63 is made between areas 46 and 58 by means of a conductive pin or the like extending through the substrate 42.

The conductive paths 40 and 48 serve as respective inductors of the resonant circuit and these paths are wound with the same sense to provide a positive mutual coupling sufficient between the inductors. The conductive areas 52 and 54 spaced by the interposed substrate 42 serve as a first capacitor, while a second capacitor is formed by the conductive area 44 cooperative with path 56 on the opposite substrate surface. The equivalent electrical circuit of the tag is illustrated in schematic form in FIG. 5 and exhibits two resonant frequencies, one employed for detection of tag presence and the other for alteration or destruction of tag resonance at the detection frequency. The inductor L1 is the outer loop 40, while the inductor L2 is the inner loop 48. Capacitor C2 is formed by conductive areas 52 and 54, while capacitor C1 is formed by conductive areas 44 and 56.

The two loops in series, composed of inductors L1, L2, and capacitor C2, are tuned to a detection frequency which may be in any convenient portion of the spectrum. Typically, a detection frequency of 5 MHz is employed. The outer loop, composed of conductor L1 and capacitor C1, is tuned to a destruction frequency which preferably is one of the frequencies allocated by the FCC for industrial, scientific, and medical purposes known as the ISM frequencies. These ISM frequencies offer the advantage of unlimited radiated power and with no requirement for an operator's license. The ISM frequencies are 13.56, 27.12, 40.00 and 905 MHz, and in the illustrated embodiment a frequency of 27.12 MHz is employed. Destruction of the resonant properties of the tag is readily accomplished by application of energy at the destruction frequency to cause fusing of link 62 such that the tag is no longer sensible by the receiving system. Sufficient power can be applied to the resonant tag at the destruction frequency to permit fusing of the link therein even though the actual resonant point of the tag circuit varies somewhat from the nominal destruction frequency.

The tag circuit can be fabricated by various printed and etched circuit techniques well known in the art. Extremely low cost fabrication can be accomplished by use of a continuous production process to provide a strip of tags which can be separated for use. Typically, in such a continuous process, an insulative strip of material is employed having a conductive foil laminated or extruded on each side thereof. The tag circuit is repetitively printed onto respective sides of the strip and the non-printed areas are etched away to provide a continuous roll of tags, which can then be cut or otherwise severed from the strip. The interconnection 63 between areas 46 and 58 are provided by any well known printed circuit technique, such as by a conductive pin or eyelet passing through the substrate, a plated-through hole or the like. The strip is typically high density polyethylene of one to two mils thickness having formed on each side thereof an aluminum foil of, typicaly, one mil thickness. The thin substrate permits easy fabrication of the interconnection 63 such as by forcing a conductive eyelet through the substrate, or spot welding the confronting areas together.

Figure 5:
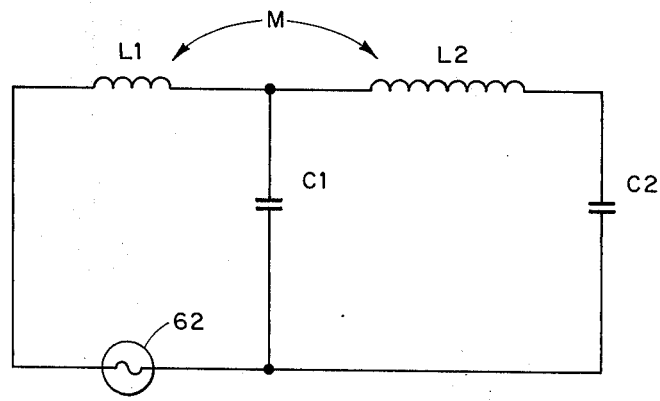
FIG. 5 is a schematic diagram of the equivalent electrical circuit of the resonant tag circuit of FIGS. 3 and 4.

The resonant circuit depicted in FIGS. 3 through 5 has been found particularly effective in the present system; however, it will be appreciated that the resonant circuit may take a variety of configurations to provide the intended destruction and detection frequencies. As an alternative, a tag circuit can be employed such as shown in the copending application Ser No. 214,361, wherein three capacitors are used to allow fabrication of the tag without electrical connection between respective sides of the circuit board. This latter embodiment generally requires a larger substrate area to accommodate the third capacitor, whcih can be formed for example by enlarged versions of areas 46 and 58.

The fusable link 62 may also be placed in circuit otherwise than as illustrated to accomplish deactivation of the tag at the detection frequency, or, as an alternative, to cause complete deactivation of the resonant circuit. The mutual coupling coefficient M between the coils of the resonant circuit can be of either positive or negative sense. When the coupling coefficient is negative, the respective tuned circuits comprising the overall tag can be separately tuned and thus simplify the design of specific tag circuits having intended resonance characteristics. Since the sensitivity of a tuned circuit is related to the total number of coil turns of the circuit inductors, the provision of a positive coupling coefficient will result in greater sensitivity since the number of turns of the circuit inductors, being wound with the same sense, will be additive. In the circuit of FIG. 5, for example, if the mutual coupling (M) is negative, the detection frequency is determined by inductor L1 in series with inductor L2 and capacitor C2, while the deactivation frequency is determined by inductor L1 in series with capacitor C1. If, however, the mutual coupling is positive, the resonant frequencies are caused by total interaction of the several inductors and capacitors.

The fusable link can also be placed within the tag circuit such that, upon destruction by an applied electromagnetic field, the tag becomes wholly inoperative. Alternatively, the link can be placed such that upon destruction, the resonant properties of the tag at the detection frequency are destroyed and the tag made operative at a third frequency different than both the detection and destruction frequencies. This third frequency can be ignored during system operation as the system does not operate at the third frequency. In an alternative embodiment, however, the third frequency, which becomes operative upon destruction of the fusible link, may be utilized to ascertain that a tag present at a controlled area has been electrically altered. This latter embodiment may be employed, for example, at an exit station of a store where the security system is operative to detect tag presence by sensing the detection frequency in order to determine whether items are being improperly removed from the store. Detection of a tag at the third frequency is indicative of an electrically altered tag and the absence of third frequency detection can indicate the presence of an item from which a tag has been removed. The use of such a third tag frequency therefore can provide an added level of security.

The invention is operative to detect amplitude, frequency or phase modulation provided by the presence of a resonant tag within the controlled area. In an implementation of the invention employing amplitude modulation, the detector 20 (FIG. 1) includes a full wave detector for sensing amplitude changes caused by the presence of a tag circuit in the interrogation field provided by the transmitting apparatus. The operation of such an amplitude detection system is best described in conjunction with the spectral diagrams of FIG. 6 and the signal diagrams of FIG. 7. The carrier frequency illustrated in FIG. 6A varies in a regularly recurring manner through a predetermined frequency range, typically ±15% of the carrier center frequency. After processing by RF bandpass filter 16 (FIG. 1), the received signal has a spectral envelope 70, as depicted in FIG. 6A, centered about the carrier $f_c$. After full wave detection by detector 20 the spectrum is as in FIG. 6B and includes a carrier spectrum 72 centered about twice the carrier frequency $2f_c$, and a signal spectrum 74 which includes the modulation frequency $f_m$. Noise components 76 are also present, as illustrated, extending from frequencies below the signal spectrum to frequencies higher than the double carrier spectrum. The signal output from detector 20 is a series of bipolar pulses as shown in FIG. 7B, each of which occurs upon traversal of the resonant detection frequency of the tag circuit by the swept carrier signal. It will be noted that adjacent pulses are of opposite sense in response to respective traversal of the resonant detection frequency in positive and negative directions by the swept carrier.

The low pass filter 22 is operative to remove the double carrier spectrum 72 as shown in FIG. 6C and the noise components above the signal spectrum. The high pass filter 24 is operative to pass only the higher frequency portion of the signal spectrum 74 as depicted on FIG. 6D. Typically, the passband of this high pass filter is from 20–100 KHz for the illustrated example where the modulation frequency is 1 KHz. It will be appreciated that since only the higher frequency portion of the signal spectrum is present, relatively steep or abruptly changing pulses such as produced by an interrogated tag circuit are more readily detectable than the less abrupt pulses provided by noise conditions or nonresonant or lossy resonant objects. In practice the spectral content of pulses due to spurious conditions is usually insufficient within the passband of the high pass filter to sustain further processing. The pulse signals provided by high pass filter 24 are amplified by amplifier 26 and are then applied to the noise rejection circuitry 28 and 30 for actuation of alarm 32.

Noise rejection circuit 28 is depicted in FIG. 8. Pulse signals from amplifier 26 are applied to positive pulse height threshold detector 78 and a negative pulse height threshold detector 80, each of which provides an output signal in response to a received signal which exceeds the corresponding threshold. The output signals from threshold circuits 78 and 80 are applied to respective pulse width discriminators 82 and 84, the outputs of which are applied to an OR gate 86. The output of OR gate 86 is applied to a flip-flop 88, a monostable multivibrator 90 and a counter 92. The output of multivibrator 90 provides a reset pulse to counter 92 and to flip-flop 88. The Q output of flip-flop 88 is employed to apply an inhibit signal to discriminator 84, while the $\overline{Q}$ output of flip-flop 88 is employed as an inhibit signal for discriminator 82. The output of the noise rejection circuit is provided by the output terminal of counter 92.

After processing by high pass filter 24, the signal becomes symmetrical in both time and amplitude and always assumes the form of a positive-negative-positive pulse followed by a negative-positive-negative pulse as shown in FIG. 9A. The maximum time between the zero crossings of these signals is fixed and determined by the cutoff frequency of the high pass filter rather than the variable properties of the resonant tag itself.

The video signal after high pass filtering is approximated by a series of alternately positive and negative pulses of predetermined maximum pulse width, pulse height, spacing sequence and the noise rejection circuit 28 is operative to provide output pulses only when precise conditions are met. During positive excursions of a received signal, the positive threshold detector 78 and the pulse width defined by discriminator 82 must be met in order to provide an output signal to the OR gate 86. Similarly, during negative excursions of the received signal, the negative threshold and pulse width defined respectively by detector 80 and discriminator 84 must be met to provide a signal to the OR gate. Flip-flop 88 is operative to inhibit one or the other of the outputs of discriminators 82 and 84 and to alternate between the two circuit polarities, causing the circuit to be sensitive only to signals of alternate polarity for each excursion of the signal received from amplifier 26.

Operation of the noise rejection circuit will be described in conjunction with the signal diagrams of FIG. 9. The video signal from amplifier 26 is as depicted in FIG. 9A and includes, during one sweep of the transmitter frequency, a pair of positive pulse portions with an intermediate negative portion therebetween, and during an opposite sweep, a pair of negative portions with an intermediate positive portion. The positive and negative threshold levels provided by detectors 78 and 80 are illustrated by dotted lines in FIG. 9A. Upon exceedance of the positive threshold level by the received signal, detector 78 provides a pulse for an interval during which the received signal exceeds the positive threshold. As shown in FIG. 9B, two pulses are provided in response to the received signal having two positive portions and a single pulse for the second signal having a single positive portion. Similarly, negative pulses are provided by the negative threshold circuit as depicted in FIG. 9C. The pulses shown in FIGS. 9B and 9C are applied respectively to pulse width discriminators 82 and 84, which provide output signals if the received pulses from the threshold circuits are at least equal to the predetermined pulse width. The output signals of positive pulse width discriminator 82 are depicted in FIG. 9D, while the output of negative pulse width discriminator 84 are depicted in FIG. 9E.

The pulses provided to OR gate 86 are of correct amplitude and width in order to have been processed by the respective threshold detectors 78 and 80 and pulse width discriminators 82 and 84. The flip-flop 88 is alternately set and reset by pulses provided by OR gate 86, and the output signals thereof are employed to alternately energize the positive and negative channels of the noise rejection circuitry. The output pulses from OR gate 86 are also applied to counter 92 which is operative to provide an output signal upon receipt of three input pulses. The input pulses to the counter 92 must occur within the time interval provided by multivibrator 90, otherwise the output signal from the multivibrator will reset counter 92 and flip-flop 88. The gating time of multivibrator 90 is as depicted in FIG. 9F and is slightly longer than the time between the maximum signal peaks of the received video signal. The noise rejection circuitry thus provides output signals for subsequent processing only if the received signals are of intended pulse height, pulse width and sequence. The erroneous processing of spurious signals, such as caused by noise conditions, is substantially reduced as it is unlikely that spurious signals will meet the several criteria specified by the circuitry of FIG. 8.

The noise rejection circuit 30, shown in FIG. 10, receives pulses from noise rejection circuit 28, the output of which is coupled to a monostable multivibrator 96 which, in turn, is coupled to an averaging and integrating circuit 98. The output of circuit 98 is applied to a threshold level detector 100, the output of which is employed to operate the alarm 32. Operation of this circuit will be described in conjunction with the signal diagrams of FIG. 11. Each received pulse from noise rejection circuit 28 shown in FIG. 11A triggers multivibrator 96 which has a period slightly less than the period of the modulation rate. The multivibrator is operative to inhibit high repetition rate noise pulses which are higher than the modulation rate. The multivibrator output signal shown in FIG. 11B is a gate which commences at the leading edge of the pulse signal (FIG. 11A) and which terminates just prior to the leading edge of the next recurring pulse. This gate signal is applied to integrating and averaging circuit 98 which typically can be an RC network.

A predetermined reference threshold is provided by detector 100 and depicted as a dotted line in FIG. 11C, and upon exceedance of the predetermined theshold level by the integrator output signal (FIG. 11C), detector 100 is operative to provide an output pulse (FIG. 11D) to cause actuation of the alarm circuitry. Noise pulses which occur at a repetition rate greater than the modulation rate do not effect circuit operation as the monostable multivibrator cannot be triggered faster than at the modulation rate. An alarm will not be provided therefore in response to fast noise inputs. For true signals occurring at the modulation rate, the integrator output voltage exceeds the threshold level within an interval of time in which a predetermined number of signal pulses is received for processing. In other words, an alarm indication is provided only after receipt of a predetermined number of pulses provided by the resonant tag. The number of pulses to cause alarm actuation is determined by the time constant of the integrating circuit 98 and the average value of the multivibrator output. Noise which occurs at less than the modulation rate does not have an average value greater than the threshold level, and no alarm results.

Figure 18:
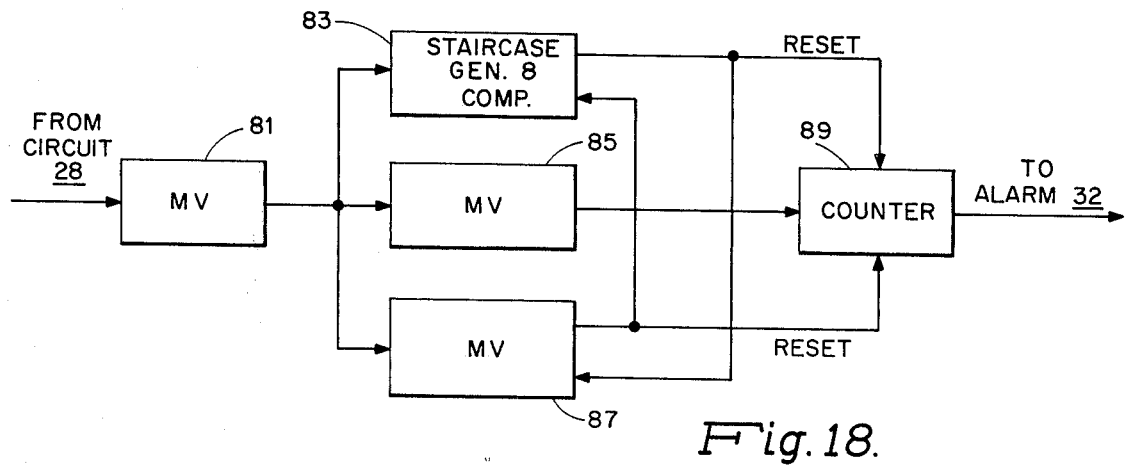
FIG. 18 is a block diagram representation of an alternative embodiment of the noise rejection circuitry shown in FIG. 10.

The noise rejection circuitry 30 can be alternatively embodied as shown in FIG. 18. Signals from noise rejection circuitry 28 are applied to a first monostable multivibrator 81, the output of which is applied simultaneously to a staircase generator and comparator 83, a second monostable multivibrator 85 and a third monostable multivibrator 87. The output of multivibrator 85 is applied to a counter 89, the output of which is a pulse train for energization of alarm 32. Staircase generator 83 is operative to apply a reset signal to counter 89 and to multivibrator 87. Multivibrator 87 is operative to apply a reset signal to counter 89 and to staircase generator 83.

Operation of the circuitry of FIG. 18 will be described in conjunction with the signal diagrams of FIG. 19. The input pulses from circuitry 28 are depicted in FIG. 19A. These pulses are applied to multivibrator 81 which is operative to produce output pulses, as depicted in FIG. 19B, of predetermined width T1 which is selected to exceed the duration of expected received signals. The standardized pulse signals from multivibrator 81 are applied to respective inputs of staircase generator and comparator 83 and multivibrators 85 and 87. The multivibrator 85 has a period equal to approximately the modulation rate, and in response to pulses from multivibrator 81, provides pulses as shown in FIG. 19D to advance the counter 89 by one count for each pulse applied thereto. The pulses T2 from multivibrator 85 commence upon the leading edge of corresponding pulses from multivibrator 81 and terminate slightly before the commencement of a subsequent pulse from multivibrator 81, and are operative to inhibit spurious input signals from advancing counter 89 at a rate faster than that of expected signals.

The output from staircase generator and comparator 83 is depicted in FIG. 19C and is seen to be a staircase voltage which rises during the duration of each pulse from multivibrator 81. A threshold circuit is provided within the staircase generator and comparator 83 and upon exceedance of a predetermined threshold level by the staircase signal, circuit 83 is operative to provide an output pulse employed to reset counter 89 and multivibrator 87 and also to reset the staircase generator itself. Noise pulses which occur at a repetition rate greater than the modulation rate cause the staircase voltage to rise to a level above the threshold to reset the system. The counter is thus reset before it has advanced to its final count so that an alarm will not be provided in response to fast noise inputs. For true signals occurring at the modulation rate, the staircase voltage does not exceed the threshold level within the interval of time in which a predetermined number of signal pulses is received for processing.

The multivibrator 87 specifies the maximum time in which the predetermined number of pulses must be received in order to provide an output pulse to the alarm circuitry. For purposes of illustration, 32 pulses are employed in the present embodiment to cause alarm actuation. The output signal from multivibrator 86 is depicted in FIG. 19E and is effectively a long gate which commences upon receipt of the first pulse from the tag circuit and which terminates at a selected time after the occurrence of the 32nd pulse. The multivibrator 87 thus has a period longer than 32 times the modulation rate, and the output pulse thereof is operative to reset counter 89 to its initial state. The counter will not generate an output pulse to the alarm circuitry if 32 pulses from multivibrator 85 are not received within the interval specified by the gate provided by multivibrator 87. Counter 89 provides an output pulse, depicted in FIG. 19F, upon receipt of 32 pulses from multivibrator 85 at the modulation rate and, as described above, noise signals will not, statistically, be operative to cause a counter output for alarm actuation.

In implementation of the invention utilizing FM detection of the presence of a resonant tag within a controlled area, the detector 20 (FIG. 1) is typically a phase locked loop, the output signal of which is a series of demodulated pulses which occur each time the transmitted carrier frequency sweeps through the resonant detection frequency of the tag. The phase shift resulting from tag presence is detected by comparing the phase of received signals with that of a local oscillator which is phase synchronized to the transmitted signal. In a phase locked loop, the received signal is automatically synchronized to the local oscillator and the phase of the transmitted signal is compared with that of the local oscillator to provide an error signal which represents the derivative of the phase between received and local oscillator signals. Referring to the spectral diagrams of FIG. 12, the output of a phase detector such as a phase locked loop is shown in FIG.

12A and includes a signal spectrum 102 which includes the modulation frequency $f_m$ together with noise components above and below the signal spectrum. After low pass filtering by filter 22 noise components above the signal spectrum are removed leaving the signal spectrum as shown in FIG. 12B. The low pass filtered output is then high pass filtered by filter 24 which passes only the higher frequency portion 104 of the signal spectrum, as depicted in FIG. 12C. This final spectrum is essentially the same as described above in connection with the amplitude modulation system, and processing continues as described above to discriminate true signals from noise and to energize an alarm only in response to valid detection of tag presence.

Phase detection can be accomplished by a switching phase detector shown in FIG. 13. The signal from RF amplifier 18 is applied to a switching phase detector 106 and also to a phase locked loop 108 which provides a reference signal to the phase detector. The output of phase detector 106 is applied to low pass filter 22, the output of which in turn is supplied to high pass filter 24 and thence to subsequent circuitry as in FIG. 1. The output of the switching phase detector 106 is similar to that of FIG. 12A for a phase locked loop detector, except that the signal component at the modulation rate $f_m$ is not eccentuated as is the case where a phase locked loop is employed, and the switching detector provides a double carrier frequency spectrum. As an alternative, the reference signal for the phase detector 106 can be provided by the transmitter 10 rather than by phase locked loop 108.

In the present system, whether AM, FM or phase modulation is employed, the detected signal occupies a frequency spectrum which extends from the modulation rate to approximately 100 times this rate. In the present instance the frequency spectrum extends from 1 KHz to 100 KHz. The low pass filter removes the carrier frequency and high frequency noise while the high pass filter removes all frequency components less than 20 times the modulation rate.

The apparatus for providing an electromagnetic field for destruction or alteration of the resonant tag circuit is shown in FIG. 14 and includes a transmitter 101 operative to provide an output at the destruction frequency of the tag circuit, and which is coupled to a balanced loop antenna 103 which is arranged to provide the destruction field for a tag in the vicinity of this field. The transmitter 101 is typically of 100 to 150 watts output power and is matched to the loop antenna 103 by means of a balanced lead configuration. One output terminal of the transmitter is coupled to a lead of loop antenna 103. The other output terminal of the transmitter is coupled to a lead 105 which follows the path of the antenna and which is connected to the antenna at a selected point 107. This lead 105 serves as an impedance matching loop and follows the configuration of the antenna loop to prevent flux leakage between the input leads and the associated antenna. The other end of antenna 103 is grounded via a variable capacitor 109. The geometry of the input leads provides effectively a tapped inductor having an intended input impedance of transmitter 101 to the input impedance of antenna 103.

Figure 15:
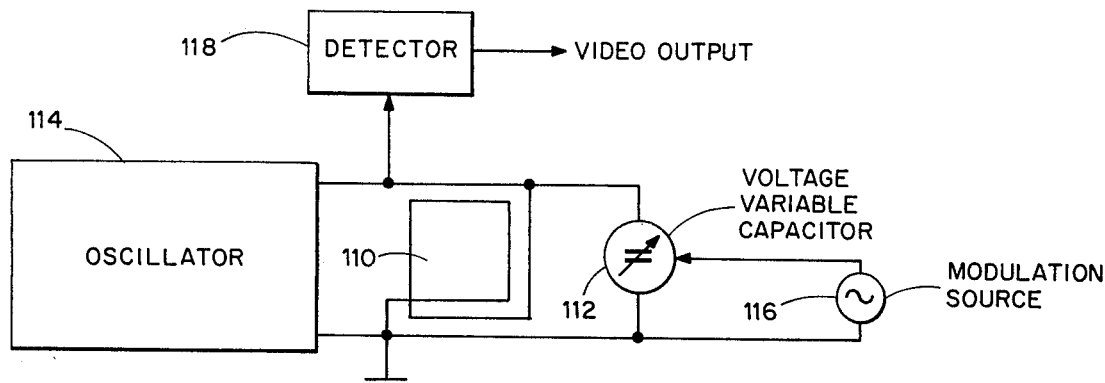
FIG. 15 is a diagrammatic representation of an embodiment of the invention employing a single resonant antenna system.

In the embodiment described above, separate transmitting and receiving antennas 12 and 14 are employed, each typically being a loop antenna. The invention also contemplates use of a single antenna system to provide both transmission and reception of electromagnetic energy. A single resonant antenna system is depicted in FIG. 15 and includes an antenna loop 110 resonant with a voltage variable capacitor 112. An oscillator 114 drives loop antenna 110 and provides the carrier signal. The modulating signal is provided by a modulation source 116 coupled to the control input of capacitor 112 to vary the capacitance thereof and thus the resonance of the tuned circuit which includes the antenna. The antenna circuit essentially functions as an oscillator tank circuit and when a resonant tag is in close proximity to the antenna and magnetically coupled to it, the antenna circuit becomes loaded with the reflected impedance of the tag circuit and the low series impedance of the tag circuit is reflected into the antenna circuit as a high real series resistance at resonance causing an abrupt change in the Q of the oscillator and a sharp drop in the voltage across the tank circuit. This voltage drop or change is sensed by a detector 118 which provides an output signal for processing such as described above in connection with the embodiment of FIG. 1.

Figure 16:
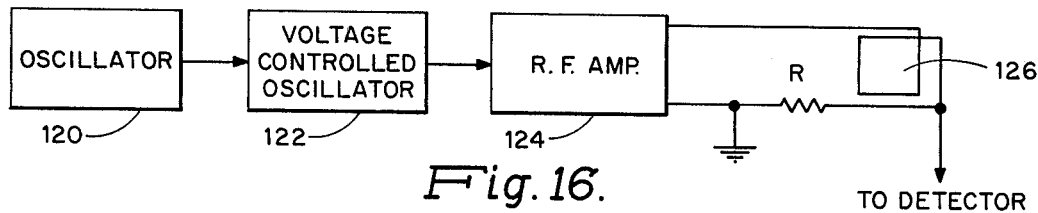
FIG. 16 is a diagrammatic representation of an embodiment of the invention employing a nonresonant single antenna system.

The invention can also employ a non-resonant single antenna system as depicted in FIG. 16 which includes an oscillator 120 driving a voltage controlled oscillator 122 which, in turn, drives a low output impedance RF amplifier 124 employed to energize a non-resonant loop antenna 126. The presence of a tag circuit in proximity to the antenna and magnetically coupled thereto causes reflection of the tag circuit impedance into the non-resonant antenna, causing an abrupt increase in the apparent resistance of the antenna and a consequent abrupt change in current in the antenna. The current change is sensed across resistor R by a detector, as in FIG. 14, to provide detected signals for subsequent processing in the manner described.

As a further alternative, separate transmitting and receiving antennas can be employed which operate in close proximity, generally less than two inches apart to provide maximum sensitivity. In the embodiment shown in FIG. 1, the loop antennas are generally a considerable distance apart and an individual carrying a resonant tag to be detected passes between the antennas which are in confronting relationship to one another. In an embodiment employing closely spaced antennas, an individual carrying a resonant tag passes through both antenna loops. In view of the proximity between the transmitting and receiving antennas, the voltage induced in the receiving antenna is partially "bucked out" to prevent receiver saturation while still permitting a full signal to be received from the tag.

Figure 17:
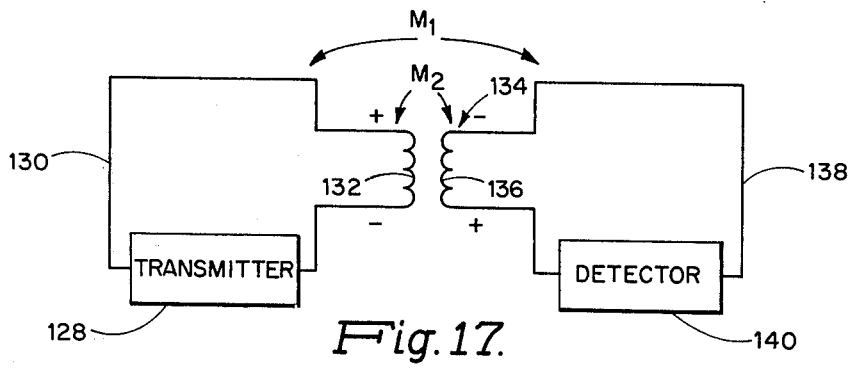
FIG. 17 is a diagrammatic representation of an embodiment of the invention using closely spaced antennas.

This closely spaced antenna version is depicted in FIG. 17 wherein a transmitter 128 is connected to an antenna loop 130 in series with one winding 132 of a transformer 134. The other winding 136 of the transformer is in series with an antenna loop 138 of the receiving antenna to which a detector 140 is coupled. The transformer 134 has a variable mutual coupling $M_2$ and since the received signal is caused by mutual coupling from the transmitter to the tag circuit and thence from the tag circuit to the detector, the coupling coefficient is adjusted to provide extremely sensitive tag detection without overloading the receiver.

The invention is not limited to use with an electronically alterable resonant tag circuit, but can be used equally as well with a tag circuit which does not include a fusable link. For some purposes it is desirable to employ a reusable tag, which can be resonant at one or more frequencies which are sensed to indicate tag presence. The tag circuit can alternatively include, for example, a single resonant circuit having a single frequency sensible at a controlled area. Or the tag circuit can be multiresonant with the plural resonant frequencies all within the frequency range of the transmitted electromagnetic field, these plural frequencies being detected by the invention to indicate tag presence. It will also be appreciated that the invention can be implemented by various circuits to accomplish intended system operation. Accordingly, it is not intended to limit the invention by what has been particularly shown and described except as indicated in the appended claims.

What is claimed is:

1. For use in an electronic security system which includes means for providing an electromagnetic field of a frequency which is swept within a predetermined range, means for detecting a first frequency within said range, and means for providing an electromagnetic field at a second frequency outside of said range, a multi-frequency resonant tag circuit containing at least first and second tuned circuits respectively resonant at said first and second frequencies comprising:
   a planar substrate of electrically insulative material;
   a first conductive path formed on a surface of said substrate in a configuration to define a first inductor;
   a second conductive path formed on said substrate in a configuration to define a second inductor;
   first and second pairs of conductive areas formed on said substrate, each pair having conductive areas in alignment on respective opposite surfaces of said substrate to define a capacitor, the conductive areas on the substrate surface containing said first and second conductive paths being electrically connected to said paths at selected points to define said first and second tuned circuits;
   a conductive path of predetermined size provided in circuit with said tag circuit on a surface of said substrate and operative to fuse upon application of electromagnetic energy at said second resonant frequency to thereby destroy the resonant properties of said tag circuit at said first frequency; and
   a conductive path provided through said substrate and completing at least one of said tuned circuits by interconnection of said first or second conductive path and one of said conductive areas.

2. For use in an electronic security system which includes means for providing an electromagnetic field of a frequency which is swept within a predetermined range, means for detecting a first frequency within said range, and means for providing an electromagnetic field at a second frequency outside of said range, a multi-frequency resonant tag circuit containing at least first and second tuned circuits respectively resonant at said first and second frequencies comprising:
   a planar insulative substrate having formed on one surface thereof
   a first conductive area centrally formed on said substrate surface;
   a second conductive area formed along one side of said substrate surface;
   a first conductive path arranged on said substrate surface between and in electrical connection with said first and second conductive areas;
   a second conductive path formed on said substrate surface between and in electrical connection with said second conductive area and a third conductive area formed on said substrate surface near a corner thereof; and wherein the opposite surface of said substrate includes:
   fourth, fifth and sixth conductive areas each in alignment and substantially coextensive with said respective first, second and third conductive areas formed on said one substrate surface;
   a conductive path connecting said fourth and fifth conductive areas;
   a conductive path through said substrate connecting said third and sixth conductive areas; and
   a conductive path interconnecting said fifth and sixth conductive areas and dimensioned to fuse upon application of an electromagnetic field of predetermined power at said second frequency to thereby destroy the resonant properties of said tag circuit at said first frequency.

3. For use in an electronic security system which includes means for providing an electromagnetic field of a frequency which is swept within a predetermined range, means for detecting a first frequency within said range and means for providing an electromagnetic field at a second frequency, a multi-frequency resonant tag circuit containing at least first and second tune circuits respectively resonant at said first and second frequencies comprising:
   a planar substrate of electrically insulative material;
   a first conductive path formed on a surface of said substrate in a configuration to define a first inductor;
   a second conductive path formed on said substrate in a configuration to define a second inductor;
   first and second pairs of conductive areas formed on said substrate, each pair having conductive areas in alignment on respective opposite surfaces of said substrate to define a capacitor, the conductive areas on the substrate surface containing said first and second conductive paths being electrically connected to said paths at selected points to define said first and second tuned circuits; and
   a conductive path provided through said substrate and completing at least one of said tuned circuits by interconnection of said first or second conductive path and one of said conductive areas.

4. For use in an electronic security system which includes means for providing an electromagnetic field of a frequency which is swept within a predetermined range, means for detecting a first frequency with said range and means for providing an electromagnetic field at a second frequency, a multi-frequency resonant tag circuit containing at least first and second tuned circuits respectively resonant at said first and second frequencies comprising:
   a planar insulative substrate having formed on one surface thereof;
   a first conductive area;
   a second conductive area;
   a first conductive path in electrical connection with said first and second conductive areas arranged in a configuration to define a first inductor;
   a third conductive area;
   a second conductive path in electrical connection with said second conductive area and said third conductive area and formed in a configuration to define a second inductor;
   said planar insulative substrate having formed on a second surface thereof:

fourth, fifth and sixth conductive areas each in alignment and substantially co-extensive with said respective first, second and third conductive areas formed on said one substrate surface, said first and fourth conductive areas and said second and fifth conductive areas comprising respective first and second capacitors;

a conductive path connecting said fourth and fifth conductive areas;

a conductive path through said substrate connecting said third and sixth conductive areas; and a conductive path interconnecting said fifth and sixth conductive areas;

said first inductor, second inductor and second capacitor being electrically connected to form said first tuned circuit; and said first capacitor, second inductor and second capacitor being electrically connected to form said second tuned circuit.

5. A multi-frequency resonant tag according to claim 4 wherein said conductive path interconnecting said fifth and sixth conductive areas is dimensioned to fuse upon application of an electromagnetic field of predetermined power at said second frequency.

6. A multi-frequency resonant tag according to claim 4 wherein in said second frequency is an ISM frequency.

* * * * *

UNITED STATES PATENT AND TRADEMARK OFFICE
CERTIFICATE OF CORRECTION

PATENT NO. : 3,967,161
DATED : June 29, 1976
INVENTOR(S) : George Jay Lichtblau

It is certified that error appears in the above-identified patent and that said Letters Patent are hereby corrected as shown below:

Column 5, line 6, "sufficient" should read --coefficient--.
Column 2, line 29, "fusable" should read --fusible--; and
          line 47, "fusable" should read --fusible--.
Column 5, line 24, "outer" should be deleted; and
          line 24, "conductor" should read --inductor--.
Column 6, line 10, "fusable" should read --fusible--; and
          line 34, "fusable" should read --fusible--.
Column 8, line 4, "spacing sequence" should read --spacing and sequence--.
Column 12, line 66, "fusable" should read --fusible--.

Signed and Sealed this

Second Day of November 1976

[SEAL]

Attest:

RUTH C. MASON
Attesting Officer

C. MARSHALL DANN
Commissioner of Patents and Trademarks